(12) United States Patent
Kochan et al.

(10) Patent No.: US 7,252,913 B2
(45) Date of Patent: Aug. 7, 2007

(54) METHOD FOR PROJECTION OF A CIRCUIT PATTERN, WHICH IS ARRANGED ON A MASK, ONTO A SEMICONDUCTOR WAFER

(75) Inventors: Bernd Kochan, Dresden (DE); Juergen Karl, Vaterstetten (DE); Michael Kubis, Dresden (DE); Norbert Haase, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 362 days.

(21) Appl. No.: 10/917,426

(22) Filed: Aug. 13, 2004

(65) Prior Publication Data

US 2005/0050512 A1     Mar. 3, 2005

(30) Foreign Application Priority Data

Aug. 13, 2003  (DE)  ................. 103 37 286

(51) Int. Cl.
*G03F 9/00*    (2006.01)
*G03C 5/00*    (2006.01)

(52) U.S. Cl. ............... 430/30; 430/5; 382/144; 716/19; 716/21

(58) Field of Classification Search ............ 430/5, 430/30; 716/19, 21; 382/144
See application file for complete search history.

(56) References Cited

U.S. PATENT DOCUMENTS 6,291,113 B1    9/2001  Spence
6,329,112 B1   12/2001  Fukuda et al.
6,401,236 B1    6/2002  Baggenstoss et al.
2002/0145719 A1  10/2002  Govil et al.

OTHER PUBLICATIONS

Olivier Toublan, et al., "Fully Automatic Side Lobes Detection and Correction Technique for Attenuated Phase Shift Masks", Deep Submicron Technical Publication, Apr. 2001, 6 pages.

*Primary Examiner*—Christopher G. Young
(74) *Attorney, Agent, or Firm*—Edell, Shapiro & Finnan, LLC

(57) ABSTRACT

A simulation is carried out of a projection based on an electronically stored circuit pattern and adjustable projection parameters and optical parameters which characterize the specific characteristics of a projection apparatus. Positions at which it is predicted that side lobes will occur in the event of an actual projection are identified in the calculated circuit pattern. The positions of the side lobes are transmitted to a manufacturing unit and are recorded in a measurement program. A wafer, which has been exposed by a mask, is inspected for side lobes, at least at precisely those transmitted positions using the measurement program. The adjustable projection parameters are adapted, a radiation-sensitive layer is removed from and reapplied to the wafer and the projection is repeated with the adapted projection parameters depending on the detection result. The control process is repeated until the side lobes have been completely prevented.

14 Claims, 3 Drawing Sheets

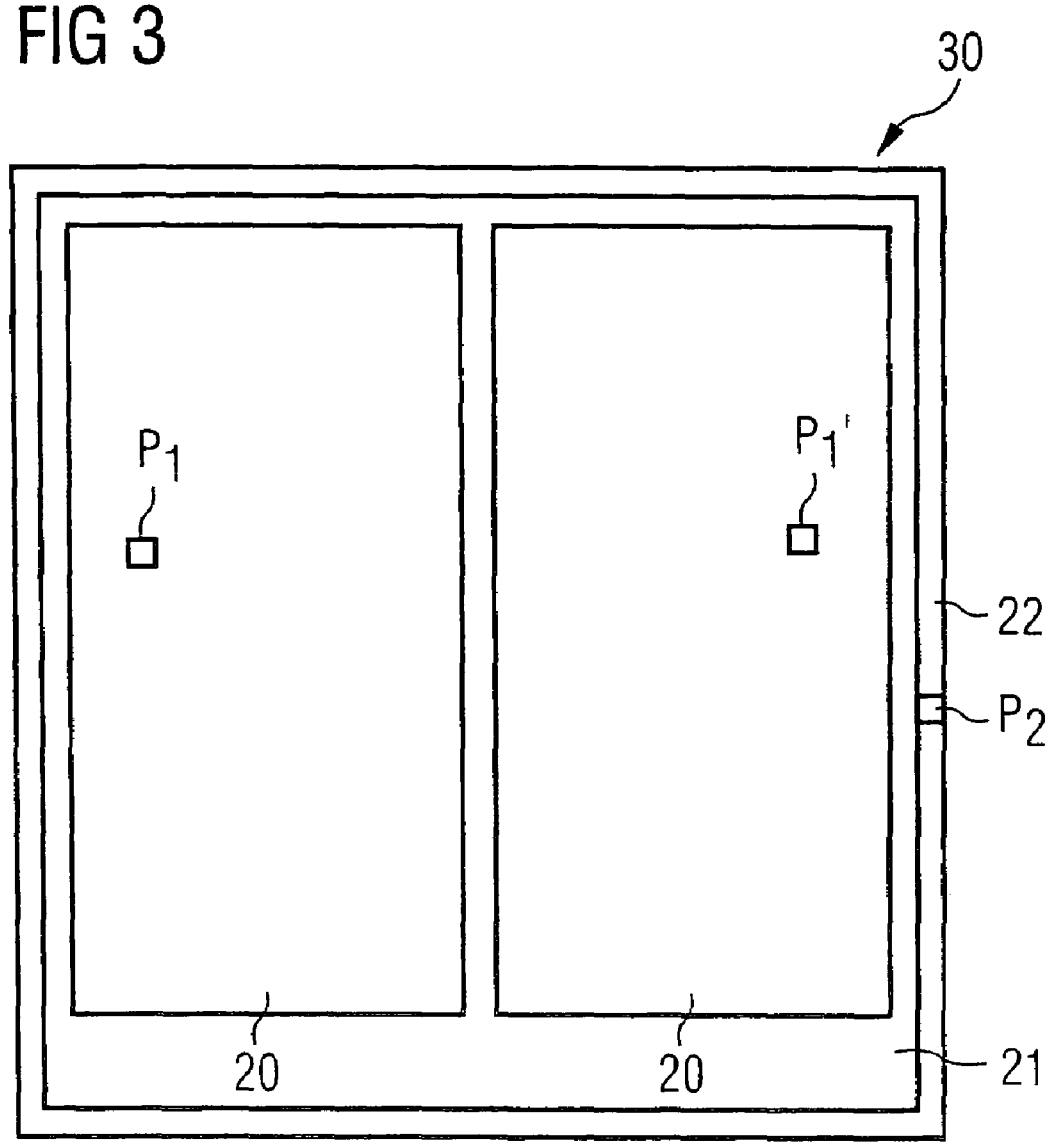

METHOD FOR PROJECTION OF A CIRCUIT PATTERN, WHICH IS ARRANGED ON A MASK, ONTO A SEMICONDUCTOR WAFER

CROSS REFERENCE TO RELATED APPLICATIONS

This application claims priority under 35 USC §119 to German Application No. DE 10337286.5, filed on Aug. 13, 2003, and titled "Method for Projection of a Circuit Pattern, Which is Arranged on a Mask, Onto A Semiconductor Wafer," the entire contents of which are hereby incorporated by reference.

FIELD OF THE INVENTION

The invention relates to a method for projection of a circuit pattern, which is arranged on a mask, into a radiation-sensitive layer which is arranged on a semiconductor wafer, and to a method for mask projection in which the formation of side lobes in the radiation-sensitive layer on a semiconductor wafer is avoided.

BACKGROUND

When circuit patterns, which are formed on chrome masks, are projected by reduction optics onto semiconductor wafers, the intensity of the zero diffraction order of the electromagnetic radiation, is used to form the structure on the semiconductor wafer. If, in general, the radiation dose of the first and of a higher diffraction order exceeds a limit value for the sensitization of the radiation-sensitive layer, then undesirable parasitic structures can be formed in the immediate vicinity of the structures, which are intended to be formed in the radiation-sensitive layer. These parasitic structures are also referred to as side lobes.

Side lobes virtually never occur in chrome masks because the intensity component in the zero diffraction order is large compared to those higher diffraction orders, and because the structure separations or grating periods of the circuit patterns are formed to be comparatively large. The interval between the diffraction orders is very small so that local maxima occur in the flanks of the resist profiles and are projected from the circuit pattern into the radiation-sensitive layer.

The circuit patterns, which are formed in a radiation-sensitive layer, are miniaturized by the use of phase masks. These result in steeper resist profiles and intensity profiles in the imaging plane. They have the intrinsic characteristic of having a greater proportion of the intensity of the light in higher diffraction orders. Due to miniaturization, their distance from a structure to be formed in the radiation-sensitive layer is greater than in the conventional case.

In particularly poor cases, diffraction maxima of a higher order of mutually adjacent structures may be superimposed on one another. This then increasingly leads to the formation of side lobes. If the radiation-sensitive layer, which has been exposed in this way, is developed, and the resultant resist structure is transferred to a layer, which represents a contact hole plane in memory products, then the formation of undesirable electrical connections and failure of the integrated circuit is possible.

This disadvantageous effect is assisted by possible drift in the wavelength of the projection light beam when it passes through different parts of the lens system of the projection optics, or of the phase mask.

If the structure of a layout pattern is transferred to a wafer by an x:1 reducing projection apparatus, side lobes may be created, for example, by pure edge diffraction as a result of discontinuous Fourier transformation, or as a result of the diffracted light being superimposed on the background radiation. The intensity of side lobes increases as the transmission increases, and, for coherent light, is described by:

$$I_{Side-Lobe} = |E_{min}|^2 = E^{2*}(1.09*SQRT(T)+0.09)^2$$

where T is the local transmission. For partial coherence, this side lobe intensity can be described by means of Lommel functions. $I_{Side-Lobe}$ for a phase mask (PSM) is in consequence greater than $I_{Side-Lobe}$ for a light/dark mask.

One particular problem with large scale integrated periodic circuit patterns is that side lobes are regularly mapped into the radiation-sensitive layer. Since side lobes occur regularly, side lobes are difficult to identify during subsequent inspection of the semiconductor wafer, particularly when no reference pattern with which the mapped circuit pattern can be compared is available for inspection. The regular arrangement of the side lobes gives the operator of the inspection equipment the impression that they represent a part of the circuit, and are thus part of the layout.

The problem of the occurrence of side lobes is identified in the back end, when functional tests of the completed circuits are carried out on the semiconductor wafer. However, the integrated circuits can no longer be repaired at this development stage, so that 50 to 100 wafer batches, each comprising 25 semiconductor wafers, for example, will often have been produced incorrectly with side lobes before the damage can be identified.

Until now, one approach has been to arrange the circuit patterns such that side lobes are deliberately used to form structures which themselves in turn represent part of the circuit pattern. However, this approach has not been found to be practicable, due to the difficulty in determining the tolerance limits for the parameters which can be used for projection, such as focus, radiation dose, numerical aperture, etc.

A known solution describes carrying out a computer simulation of the transfer of the circuit pattern to the radiation-sensitive layer. The simulation is carried out based on the electronically stored data (layout data), which represents the circuit pattern, and the projection apparatus parameters, which are set for the projection. The simulation result is used to identify positions in the electronically stored circuit pattern at which the side lobes are predicted to occur during projection under the stated conditions. The design of the electronically stored circuit pattern at the corresponding positions, and in the vicinity of these positions, is changed in a subsequent step to predict that side lobes will no longer occur. The mask with the changed circuit pattern is not produced until this stage, and is used for the actual projection onto a semiconductor wafer.

An analogous method for identification of side lobes and for correcting them can also be found, for example, on the Internet at:

http://www.mentor.com/dsm/techpapers/mentorpaper_2964.pdf.

The known methods, however, do not take account of large-volume manufacturing conditions. Typical large-volume manufacturing sites producing 10,000 to 50,000 or more wafer starts per month have a large number of exposure systems and projection apparatuses. Some of which differ not only in manufacturers or different technology generation, but also, even if the equipment type is identical, considerable discrepancies, for example, with respect to lens characterization or the radiation source. Each of the individual exposure systems has its own individual tolerances, which are dependent on manufacture, which, if exceeded make the formation of side lobes during projection probable. Even during the design stage of the circuit pattern, a single computer simulation cannot take account of these differences in the manufacturing conditions.

Taking into account manufacturing conditions, a method for wafer exposure which can avoid the occurrence of side lobes is desirable.

SUMMARY

A method for projection of a circuit pattern, which is arranged on a mask, into a radiation-sensitive layer which is arranged on a semiconductor wafer, can include providing electronically stored data, which represents the circuit pattern, performing projection based on a predetermined set of parameters in a projection apparatus, carrying out a numerical simulation of the projection based on the electronically stored data and the parameters in order to calculate a circuit pattern which is mapped, in the radiation-sensitive layer, determining a position of at least one simulated side lobe in the calculated circuit pattern, projecting the circuit pattern onto the semiconductor wafer using the predetermined parameters in the projection apparatus, inspecting the circuit pattern, which is projected onto the semiconductor wafer, at the defined position in order to detect a side lobe which is formed in the radiation-sensitive layer during the projection process, removing the radiation-sensitive layer and re-applying the radiation-sensitive layer depending on the detection result, changing the value of at least one of the parameters, and repeating the projection using the partially changed parameters.

The invention is based on the idea of using a simulation of the lithographic structure transfer (projection) from a mask on to a semiconductor wafer to detect side lobes in the mapped circuit pattern as calculated by simulation, and to report the position of the side lobes to a manufacturing unit. A semiconductor wafer which has been produced in the projection conditions, characterized by the process parameters, can then be specifically inspected based on these specific positions to determine whether the side lobes have been transferred to the exposed semiconductor wafer, forming this structure. The predictions from the simulation need not necessarily occur in the specific manufacturing conditions, particularly in the case of large-volume manufacture. This depends on the specific optical characteristics of the respective different projection apparatuses and the actual background characteristics of the semiconductor wafers to be exposed. According to the invention, the result of the numerical simulation is thus used as information indicating a suspicion of the occurrence of side lobes, and is, for instance, recorded in a measurement program for inspection of the wafer.

A lithographic process for transferring a circuit pattern to a layer plane on a semiconductor wafer in order to form an integrated circuit is typically carried out in a control loop. The control loop includes projecting a circuit pattern from a reticle onto a wafer, inspecting the wafer in order to determine defects, adapting the exposure conditions are adapted so that defects are avoided, removing a radiation-sensitive layer is removed, re-applying the radiation-sensitive layer, and repeating the projection.

As has been previously described, it has been difficult to identify side lobes by inspection due to their regular arrangement in a periodic grid. Using the method according to the invention, the positions of the side lobes as determined in the simulation method allow the appropriate coordinates to be extracted, and to be checked during the measurement of the product which is actually produced.

The simulation is carried out based on electronically stored data which represents the circuit pattern. The circuit pattern is the plane of a circuit to be structured one mask plane of a mask set, as well as the measurement structures, which are typically placed in the peripheral area, for example, the sawing frame, of the circuit, for example, for adjustment of the mask or of the wafer in a projection or measurement apparatus. Circuit patterns are, in general, produced in prior, further simulations, in which the requirements to be met by an integrated circuit as well as technological constraints are predetermined. The prior simulations generally relate to optimization of the circuit wiring to be produced, taking into account the stated requirements. Simulations such as these are carried out in the design stage for the production of an integrated circuit.

The overall layout of the integrated circuit produced in the prior simulation is subdivided into individual planes, which are associated with the respective masks and each have a circuit pattern. For this purpose, the data produced in the prior simulation is transferred to the GDSII format, which allows a hierarchical data representation, plane-by-plane, of a circuit. In addition to the GDSII format, any other data formats in which the circuit patterns are stored may, of course, also be used for the method according to the invention.

The result of the simulation of the projection of the pattern from a mask onto a substrate depends on the specific choice of the exposure parameters. These are, for example, the numerical aperture of the diaphragm system, the coherence factor σ of the annular exposure setting, the focus, the radiation dose, etc. This group of parameters includes those parameters which can be set within predetermined limits, when carrying out a projection. Accordingly, these parameters generally depend on the respective projection apparatus for these limits.

The result of a simulation may initially be an air image with an intensity distribution within the image plane of the semiconductor wafer. If resist characteristics and further background characteristics of the semiconductor wafer are also predetermined, then the simulation can also be used to predict where structures will be created in the radiation-sensitive layer on the semiconductor wafer. The detection of side lobes includes a comparison of the calculated air image or of the calculated structure image in the radiation-sensitive layer with the ideal circuit pattern. The simulation may be carried out on any desired data processing equipment, for example, a PC or a workstation, etc., using commercially available programs, such as Prolith from the Finle company or Solid-C from Sigma-C.

Detailed intermediate steps relating to the production of the mask, in particular, the addition of OPC structures and mask biasing, will not be explained in more detail here, and reference is instead made to the description of the exemplary embodiment. Further intermediate design steps will be familiar to those skilled in the art relating to the technical field of Computer Aided Design (CAD), to whom it will be clear whether such intermediate steps are necessary or superfluous in an individual case.

Before the photolithographic projection step is actually carried out onto the semiconductor wafer, the mask is produced from the circuit pattern, including the OPC structures as well as adjustment and measurement marks which have been mentioned. According to the invention, this may be any desired mask type, in particular, half-tone, alternating, tri-tone, chromeless phase masks, simple chrome masks, EUV, or X-ray masks, based both on transmission and reflection techniques. The method according to the invention also includes simulation of multiple exposures. Multiple exposures are used, for example, for separate exposure of dense memory cell arrays and of a less dense periphery, in order to produce memory modules. In situations such as this with multiple exposures, it may a priori be particularly difficult to predict side lobes, since simulation of one of the two masks required for multiple exposure produces a side lobe intensity maximum which in fact does not yet reach a threshold value for structure formation, but which is increased above this limit value by the exposure of the second mask.

The simulation may be carried out before the production of the mask or of the reticle, and the corresponding position in the circuit pattern is marked as a consequence of detection of a side lobe in the calculated data. A detail with the area around the determined position is then extracted, and is copied into a measurement mark area at the edge of the circuit pattern, where the extracted and copied detail acts as a measurement mark for determination of side lobe sensitivity in the projection. Both the visual and automatic inspection can be carried out relatively more easily and relatively more quickly in the problematic detail, i.e., the side lobe measurement mark, in the measurement mark or edge area of the circuit pattern.

A further simulation of the projection behavior can be carried out after adaptation of the projection parameters within the control loop. This is, for instance, done in the wafer manufacturer's manufacturing unit. Before the projection step is repeated, the simulation result together with, if appropriate, the detection of any side lobe which still exists, can either be used to carry out a further optimization of the projection parameters or, if this does not produce satisfactory results, feedback can be provided to the designer unit in order to adapt the circuit pattern in the course of the prior technology and circuit simulation. A new reticle can then be produced, with the projection being continued using this reticle.

The optical parameters of the projection apparatus used for the projection can be taken into account before and/or after production of the measurement program for simulation of the lithographic projection step. These parameters may, for example, be stored in a database in which the status of the system tools is stored, and may be extracted at the time of the simulation. It is possible to diversify the various conditions of the individual projection apparatuses, and to take account of the current state of manufacture, if, for example, drift problems occur in the individual projection apparatuses.

BRIEF DESCRIPTION OF THE FIGURES

The invention will now be explained in more detail using an exemplary embodiment and with the aid of a drawing, in which:

FIG. 3 shows an example of the positions, which are transferred to a measurement program, for the predicted occurrence of side lobes.

DETAILED DESCRIPTION

Figure 1:
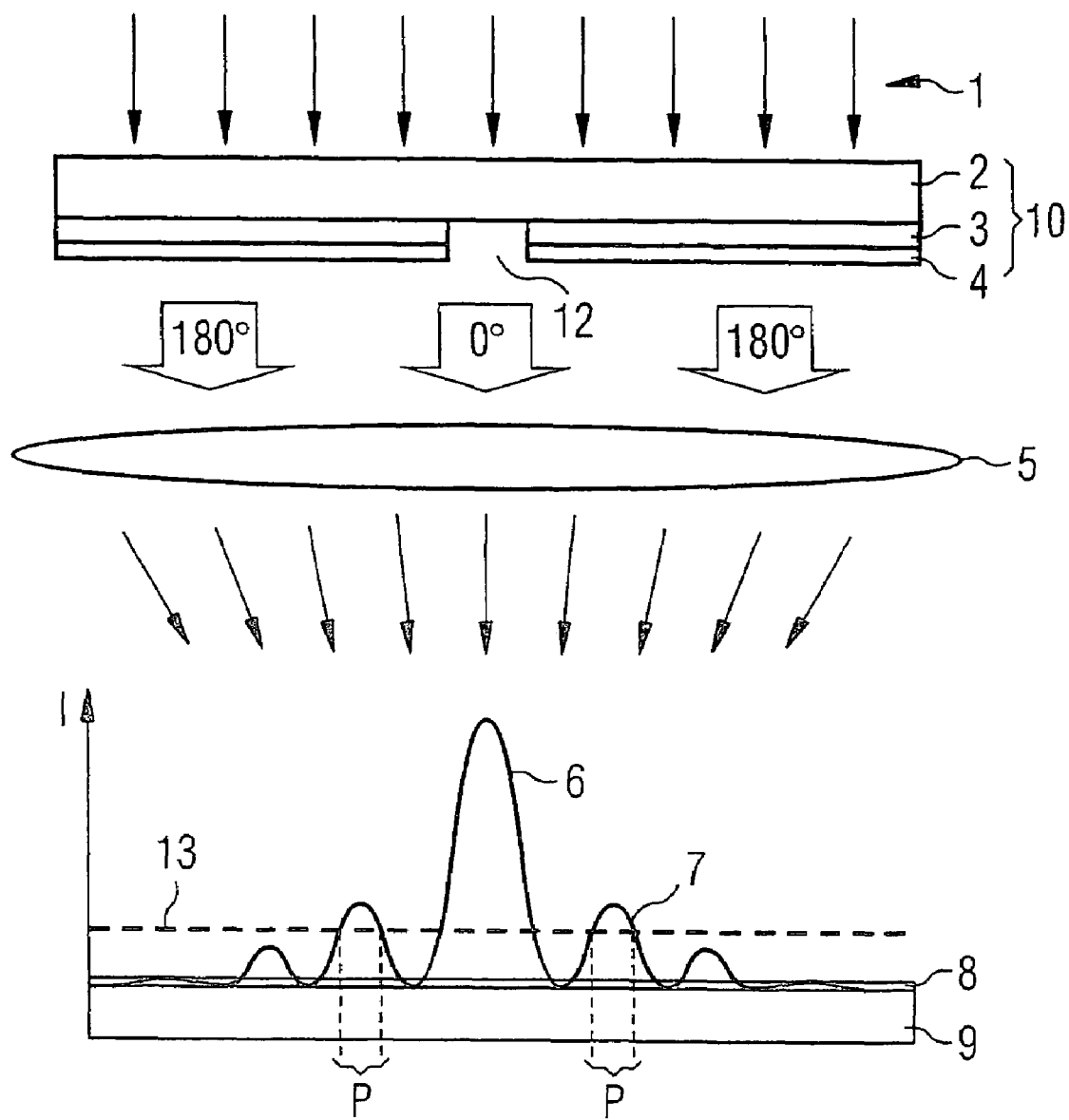
FIG. 1 shows a schematic illustration relating to the occurrence of side lobes during a projection.

FIG. 1 shows a schematic illustration of the intensity distribution of a light beam 1 which strikes a mask 10 through a gap 12 and maps this in a radiation-sensitive layer 8 on a semiconductor wafer 9. The light beam 1 originates, for example, from a radiation source which does not emit at the wavelength 193 nm. The mask 10 is a half-tone phase mask. A phase-shifting layer 3 and a semitransparent layer 4 are arranged on a transparent quartz substrate 2. The phase-shifting layer 3 and the semitransparent layer 4 may be the same layer, for example, composed of molybdenum silicide. The light, which is diffracted at the gap 12, is focused via a lens system 5 into the radiation-sensitive layer 8, where it produces an intensity distribution with a zero diffraction maximum 6, a first diffraction maximum 7 as well as further, higher-order diffraction maxima. The image structure of the gap 12 to be imaged on the semiconductor wafer 9 includes, for example, the extent of the zero diffraction maximum 6. If the limit value 13, which is indicated by the dashed line in FIG. 1 and at which the radiation-sensitive layer, is exposed forming a structure is below the intensity maximum of the first diffraction order 7, then a side lobe 15 can be formed at the corresponding positions P in the radiation-sensitive layer 8.

The illustration in FIG. 1 is intended as a simplified illustration. The occurrence of effects which promote side lobes and which are not shown in FIG. 1 relate to aberrations of the lens system 5, wavelength drifts of the radiation source, or gaps 12 being relatively closely adjacent to one another, so that higher diffraction orders of adjacent gaps 12 exceed the limit value 13 only when superimposed.

Figure 2:
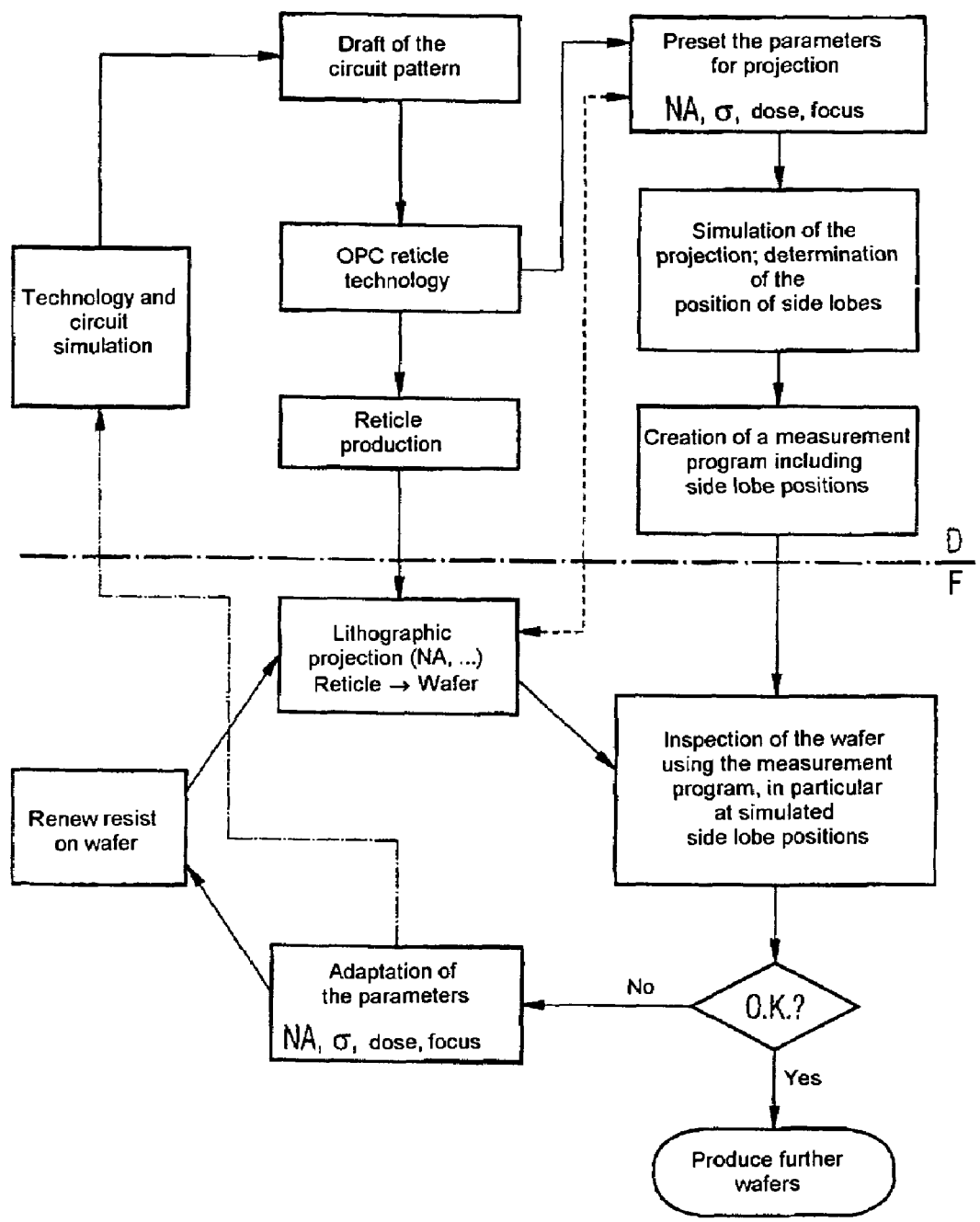
FIG. 2 shows a flowchart of one exemplary embodiment of the present invention.

FIG. 2 shows an example of the procedure for the method according to the invention. A circuit draft is produced by a technology and circuit simulation in a designer unit of the manufacturer for integrated circuits. OPC structures are added to the circuit pattern transferred to the GDSII format, in order to correct out imaging effects, such as line shortening, etc. A mask bias is added to the circuit pattern, which is stored in electronic form, for each of the structure elements contained, based on the reticle technology which is used. This mask bias compensates for effects in the case of reticle production on the lithographic projection of the reticle onto the wafer.

The corresponding reticle is produced in the mask block associated with the designer unit D in the figure, with the OPC-corrected, electronically stored circuit pattern being preset. The reticle is passed to a manufacturing unit F in order to carry out the lithographic projection.

Values for the exposure parameters including the numerical aperture NA, the coherence factor σ, the dose and the focus are defined for the projection of the reticle onto the wafer based on the technological requirements for the production of the current circuit plane. The choice of the projection apparatuses which are available for projection of the current plane is restricted in the manufacturing unit F on the basis of these requirements (indicated by the dashed line in FIG. 2).

A specific projection apparatus is selected for the projection, and the optical parameters for this projection apparatus are extracted from a database and are transmitted to the designer unit carrying out the simulation. The details include, for example, wavelength, spatial coherence degree, time coherence degree, laser tilde, pulse repetition frequency, pulse intensity of the radiation source, beam divergence, apodization of the illumination system, Zernicke polynomial coefficients of the projection optics, Dill parameters, gradation of the radiation-sensitive layer, 3D profile parameters, reflection, and absorption of the topological background on the semiconductor wafer.

A simulation of the projection is carried out using the defined or predetermined parameters which can be set for the projection, as well as the optical parameters, which are specifically applicable to the projection apparatus to be used. The three-dimensional structure of the reticle is also included in the calculations. The circuit pattern which is predicted to be formed as a structure in the radiation-sensitive layer 8 on the semiconductor wafer 9 based on the simulation calculation, is compared with the ideal pattern after addition of the OPC correction. Different structures, in particular, those which occur at a distance from master structures within dense structure areas, are identified as side lobes. The coordinates of the side lobes are determined, and are incorporated in a measurement program for an inspection appliance, for example, a microscope. The measurement program is used to transmit the side lobe positions to the manufacturing unit.

The lithographic projection of the reticle onto the wafer with the defined parameters for the projection is carried out in the manufacturing unit. The exposed wafer is subject to an inspection in a microscope instrument. This is done using the measurement program that has been produced, by moving to the respectively determined side lobe positions. If no artifacts similar to side lobes are present at these positions on the actually exposed wafer, the exposure of other wafers is continued.

If, in contrast, side lobes are found, then at least one of the parameters including the numerical aperture, the coherence factor δ of the annular diaphragms, the dose, the focus is adapted such that the side lobes disappear when the wafer is exposed again. The equipment-specific tolerances and the process window, which is available for compliance with product-specific tolerances (dosage range, focus range), is, in particular, taken into account in this case. Which parameter can be varied in what direction depends, for example, on the experience of the projection apparatus specialist. However, the necessary adaptations can be determined relatively clearly, depending on the current form of the side lobes in the structured circuit pattern. It is thus also possible to carry out this process in an automated form. The varied parameters are, for instance, used to carry out a further simulation, with the assistance of the equipment-specific optical parameters. A proposal can also be made to change to another projection apparatus based on the parameters, which can be set are the same, but the optical parameters can be changed.

In the meantime, the exposed resist on the wafer is removed, and is replaced by a new radiation-sensitive layer 8. If the resist is not the same as that used for the first exposure, then the characteristics which have been changed as a result of this are taken into account in the simulation.

If the simulation shows that, for any given variations of parameters which can be adjusted and of the optical parameters of the projection apparatuses which are available in the manufacturing unit F, there is a probability of side lobes occurring after the repeated projection, then this could be fed back as appropriate to the designer unit D (dash-dotted line). A new draft of the circuit pattern can accordingly be produced, with a further technology and circuit simulation, and with the pattern being adapted at the selected points for the occurrence of the side lobes.

If, however, a suitable parameter combination is found, the newly lacquered wafer 9 is once again subject to the lithographic projection step, using the adapted, adjustable parameters. The previously used reticle is also used once again for this purpose. The control loop can be repeated indefinitely, until a satisfactory result is achieved. If this is not achieved, then the option of the described adaptation of the circuit draft (dashed-dotted line) is available. The procedure then passes through the control loop with a new reticle and with an adapted measurement program. In this case, the measurement program includes the newly determined positions of side lobes in a simulation, if any such side lobes occur at all.

FIG. 3 shows a detail of the circuit pattern 30 formed on a mask 10. The circuit pattern represents, for example, the distribution of trench capacitor pairs in memory cell arrays for the production of DRAM modules. The figure shows two memory cell arrays 20 with a large scale integrated arrangement of pairs of rectangular structures. The two cell arrays 20 are embedded in a peripheral area 21 which surrounds them. The peripheral area 21 includes structure elements, which can be used for connection of the memory cells to be formed. The structure density is rather low in this case. The probability of the occurrence of side lobes within the memory cell arrays 20 is relatively high, while that in the peripheral area 21 is relatively low.

Side lobes were found at the positions $P_1$ and $P_{1'}$ in a simulation step carried out according to the invention. Before the mask and/or the reticle is/are produced with the circuit pattern having been preset, the circuit pattern is modified such that the pattern element located within the areas associated with the positions $P_1$ and $P_{1'}$ is extracted and is placed at a position $P_2$ in the sawing frame area 22. The extracted pattern elements still, of course, remain within the memory cell arrays. The extracted pattern element in the sawing frame area is used as a measurement mark for detection of side lobes during projection. The mask or the reticle is produced including this additional measurement mark. The measurement within the control loop, which was described initially, is now carried out based on the measurement mark at the position $P_2$. The position $P_2$ is recorded in a measurement program, which is produced specifically for inspection.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS

1 Light beam
2 Quartz substrate
3 Semitransparent layer
4 Phase-shifting layer
5 Lens system, objective lens
6 Zero diffraction order
7 First diffraction order
8 Radiation-sensitive layer
9 Semiconductor wafer
10 Phase mask
12 Transparent structure element on a marks
20 Memory cell array for a dram module
21 Peripheral area, drive logic for the cell array
22 Frame area with measurement marks
30 Circuit pattern D Designer unit
F Manufacturing unit
P Side lobe position

We claim:

1. A method for projecting a circuit pattern, which can be arranged on a mask, into a radiation-sensitive layer, which is arranged on a semiconductor wafer, the method comprising:
   a) providing electronically stored data in a designer unit, the data representing the circuit pattern;
   b) defining a set of values for parameters by which the projection can be carried out in a projection apparatus;
   c) carrying out a simulation based on the electronically stored data and the parameters in order to calculate a circuit pattern produced by projection in the radiation-sensitive layer on the semiconductor wafer;
   d) identifying a defined position of at least one simulated side lobe in the calculated circuit pattern;
   e) producing the mask with the circuit pattern based on the electronically stored data, and transferring the mask to a manufacturing unit;
   f) projecting the circuit pattern into the radiation-sensitive layer on the semiconductor wafer using the predetermined parameter values in the projection apparatus;
   g) inspecting the circuit pattern, which is projected onto the semiconductor wafer, at the defined position in order to detect a side lobe formed in the radiation-sensitive layer during the projection process;
   h) removing the radiation-sensitive layer and reapplying the radiation sensitive layer depending on the detection result; and
   i) changing the value of at least one of the parameters in f) and repeating using the at least one changed parameter value.

2. The method as claimed in claim 1, wherein a detail of the circuit pattern in the electronically stored data is selected in the vicinity of the defined position depending on the identification carried out in d), and is copied, with the electronic data being changed, to an edge area of the circuit pattern which is provided for measurement marks, the mask in being produced based on the changed data.

3. The method as claimed in claim 1, wherein in i), after the change to the parameter value and before the repetition of the projection step, i) comprises:
   performing a further simulation to calculate a circuit pattern which would be produced by projection in the radiation-sensitive layer;
   repeating identification of a position, which remains unchanged even after the change to the at least one parameter value, of a side lobe in the calculated circuit pattern;
   transmitting the position to the designer unit;
   adapting the electronically stored data which represents the circuit pattern as a function of the transmitted position; and
   repeating e) to produce the mask.

4. The method as claimed in claim 2, wherein at least one changed parameter is a parameter in a group including: radiation dose, focus plane, numerical aperture, and coherence factor of annular diaphragms.

5. The method as claimed in claim 1, wherein the manufacturing unit has a large volume and includes at least ten different projection apparatuses.

6. The method as claimed in claim 1, wherein the further simulation is carried out including at least one optical parameter which is predetermined such that the at least one optical parameter is fixed for that respective one of the projection apparatuses in which the projection onto the semiconductor wafer was carried out in f).

7. The method as claimed in claim 6, wherein the fixed predetermined optical parameter is a parameter from the group including: wavelength, spatial coherence degree, time coherence degree, laser tilde, pulse repetition frequency, and pulse intensity of a radiation source of the projection apparatus.

8. The method as claimed in claim 6, wherein the fixed predetermined optical parameter is a parameter from the group including: beam divergence, and apodization of an illumination system of the projection apparatus.

9. The method as claimed in claim 6, wherein the fixed predetermined optical parameter is a parameter from the group including Zernicke polynomial coefficients of the projection optics.

10. The method as claimed in claim 6, wherein the fixed predetermined optical parameter is a parameter from the group including Dill parameters gradation of the radiation-sensitive layer.

11. The method as claimed in claim 6, wherein the fixed predetermined optical parameter is a parameter from the group including: 3D profile parameters, reflection, absorption of the topological background on the semiconductor wafer.

12. The method as claimed in claim 3, wherein the mask which is produced based on the electronic data, and the further mask, which is produced based on the adapted electronic data, are projected onto the semiconductor wafer using the same projection apparatus.

13. The method as claimed in claim 3, wherein at least one changed parameter is a parameter in a group including: radiation dose, focus plane, numerical aperture, and coherence factor of annular diaphragms.

14. The method as claimed in claim 6, wherein the mask which is produced based on the electronic data, and the further mask, which is produced based on the adapted electronic data, are projected onto the semiconductor wafer using the same projection apparatus.

* * * * *